United States Patent [19]
Xu et al.

[11] Patent Number: 5,540,786
[45] Date of Patent: Jul. 30, 1996

[54] LIGHT EMITTING MATERIAL

[75] Inventors: Gui C. Xu, Beijing, China; Iam K. Sou, Kowloon, Hong Kong; Kam S. Wong, Kln, Hong Kong; Hong Wang, Kowloon, Hong Kong; Zhi U. Yang, Kowloon, Hong Kong; George K. L. Wong, Kowloon, Hong Kong

[73] Assignee: The Hong Kong University of Science & Technology, Hong Kong

[21] Appl. No.: 407,635

[22] Filed: Mar. 21, 1995

[51] Int. Cl.⁶ .................................................. H01L 29/12
[52] U.S. Cl. .................... 148/33.4; 148/33.5; 437/127; 437/133
[58] Field of Search .......................... 148/33, 33.4, 33.5, 148/DIG. 64; 437/126, 132, 133, 127, 965

[56] References Cited

U.S. PATENT DOCUMENTS

| | | | |
|---|---|---|---|
| 5,057,183 | 10/1991 | Tomomura et al. | 117/105 |
| 5,081,632 | 1/1992 | Migita et al. | 372/45 |
| 5,198,690 | 3/1993 | Kitagawa et al. | 257/200 |
| 5,278,856 | 1/1994 | Migita et al. | 372/45 |
| 5,319,219 | 6/1994 | Cheng et al. | 257/14 |
| 5,406,574 | 4/1995 | Rennie et al. | 372/45 |

*Primary Examiner*—R. Bruce Breneman
*Assistant Examiner*—Ramamohan Rao Paladugu
*Attorney, Agent, or Firm*—Burns, Doane, Swecker & Mathis

[57] ABSTRACT

A novel photoluminescent material is disclosed comprising an active layer of $ZnS_{1-x}Te_x$ deposited directly onto a substrate by molecular beam epitaxy. The emitted light is primarily in the blue end of the spectrum. The substrate may be GaAs or more preferably Si. Depositing the material directly onto Si allows the material to be used to manufacture integrated semiconductor light emitting devices. High efficiency may be obtained at low concentrations of Te $(0.01 \leq x \leq 0.07)$ which allow good lattice matching of the active layer to an Si substrate.

4 Claims, 3 Drawing Sheets

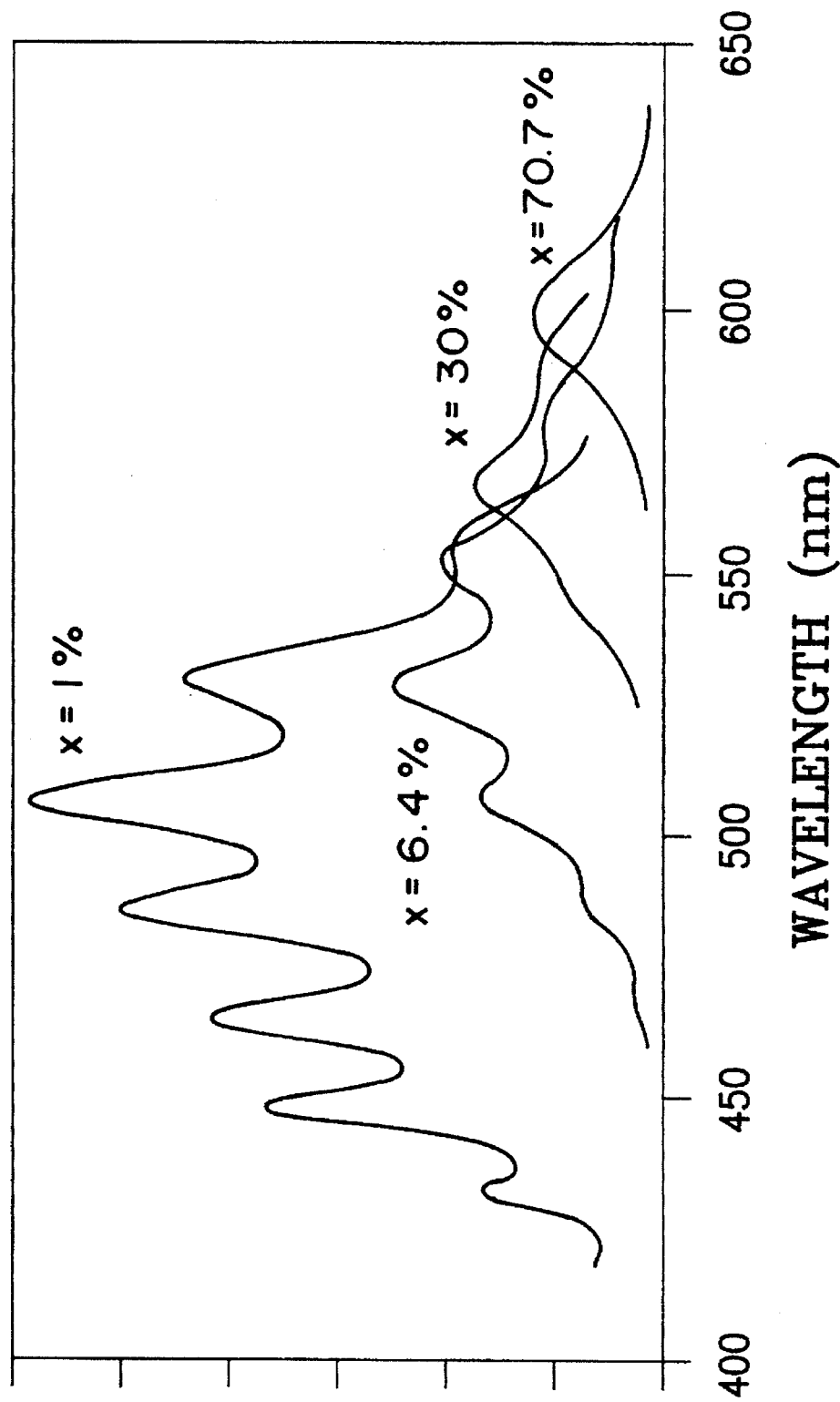

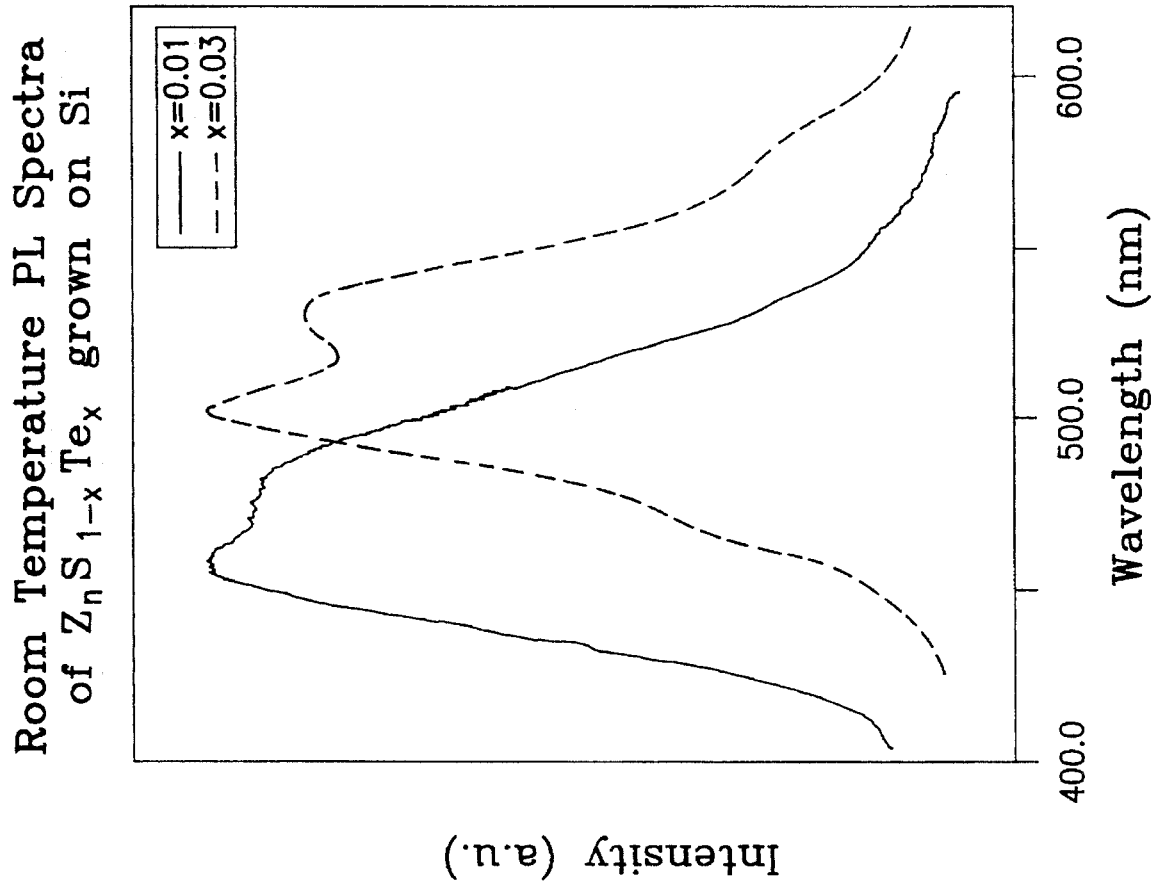

LIGHT EMITTING MATERIAL

FIELD OF THE INVENTION

This invention relates to a light emitting material, and in particular to a material suitable for use in an optoelectronic device which may emit light in the yellow to blue region of the spectrum and which may be employed as part of an integrated circuit. The invention relates in particular to such a material suitable for use in a device that may be formed as an integral part of an integrated circuit.

BACKGROUND OF THE INVENTION

A wide variety of optoelectronic devices are known for emitting light and which may be used in various devices such as calculator displays, flat screen television screens and many other applications. Among various well known existing devices are light emitting diodes (LEDs), laser diodes, liquid crystals and electroluminescent devices.

A light emitting diode is a semiconductor device, in particular it is a p-n junction diode, that emits light as a result of direct radiative recombination of excess electron-hole pairs. In a semiconductor such as GaAs a significant amount of light can be emitted following injection of excess minority carriers. The useful light obtainable from such a device is dependent on various factors including the optical quality of the crystal surfaces. The colour of the light emitted is a property of the material used as the semiconductor since the energy of the emitted light is determined by the band-gap energy. Such devices are advantageous in that they can be made very small and if desired can be formed as part of an integrated circuit using convention circuit fabrication technologies. A disadvantage however is that the range of colours available from such devices are limited by the number of suitable materials available. The majority of suitable semiconductors, such as GaAs, emit useful light only in the red end of the spectrum.

Another known optoelectronic method of generating light is by utilising the property of electroluminescence. This is the emission of light by certain phosphorescent materials under the influence of an applied electric field. Again, however, with known materials there are problems with constructing a device that emits light at shorter wavelengths toward the blue end of the spectrum. This problem is compounded when attempting to find such a material that will emit blue light and which can be integrated into a circuit directly.

PRIOR ART

Many studies have been made of the properties of various semiconductor materials in the search for suitable materials for emitting blue light in optoelectronic devices. For example a blue light emitting diode was disclosed by K. Akimoto et al: *Japan J. Appl. Phys.* 28 (1989) L2001. This LED comprises a substrate made of GaAs (100), a n-type ZnSe:Ga layer and a p-type ZnSe:O layer. In such a construction the ZnSe layer emits the blue light and the device as a whole is capable of emitting blue light at a peak wavelength of 400 nm. However this can only be achieved at a liquid nitrogen temperature of 77K and almost no emission is provided at room temperature. Clearly this is unsuitable for any practical application.

U.S. Pat. No. 5,198,690 to Kitagawa et al suggests the use of a II–IV compound semiconductor using zinc as an essential composite element. Kitagawa et al propose a wide range of materials such as ZnS, ZnTe, ZnSe, ZnCdS, ZnCdTe, ZnSTe, ZnSeTe, ZnBeS, ZnBeSe, ZnHgTe, ZnHgS, ZnMgTe and ZnBeTe. However although Kitagawa et al disclose a large number of examples in all the examples the light emitting layer is chosen from ZnSe, ZnS or a solid solution of ZnSSe. ZnS and ZnSSe are also disclosed as blue light emitting materials in U.S. Pat. No. 5,057,183 to Tomomura et al. Other materials such as CdS, HgS, MgS, CaS, ZnCdS, ZnHgS, CaHgS, ZnSSe, CdSSe, ZnSTe and CdSTe are suggested but not tried by Tomomura et al. U.S. Pat. No. 5,278,856 to Migita et al discloses $ZnS_xSe_{1-x}$ as a light emitting material, and also discloses $ZnS_{1-x}Te_x$ grown on GaPAs, ZnSe and InP substrates. In Migita et al, however, the active luminescent layer is sandwiched between two cladding layers of p-type and n-type semiconductor materials respectively. Furthermore in Migita et al the source of the luminescence is believed to be a direct band to band transition mechanism, and as a consequence of this Migita et al proposes a relatively high concentration of Te, in particular $0.12 < x < 0.42$.

SUMMARY OF THE INVENTION

According to the present invention there is provided a photoluminescent material comprising an active luminescent layer of $ZnS_{1-x}Te_x$ ($0 < x < 1$) deposited directly on a substrate selected from the group consisting of GaAs or Si, said active layer being deposited by molecular beam epitaxy.

One of the advantages of $ZnS_{1-x}Te_x$ as an active material is that by varying the value of x the alloy layer can be lattice matched to the substrate. Silicon is a particularly preferred substrate material since extremely high-quality large-area substrates are available at low cost. More importantly perhaps, forming the device by depositing the active layer directly on a silicon substrate allows a light emitting device capable of emitting blue light to be incorporated directly into an integrated circuit. Preferably therefore the active luminescent layer is deposited on a Si substrate. Furthermore the present applicants have discovered that the luminescence comes from recombination of excitons trapped by Te isoelectronic traps. This means that in fact strong luminescence can be obtained with low Te concentrations, and indeed the luminescence efficiency will in fact decrease significantly with increasing Te concentration after $x=0.10$. Preferably therefore $0.01 \leq x \leq 0.07$ and in particular it is preferred that $x=$approximately 0.03.

When Si is used as the substrate care has to be taken to minimise the problems that can occur at the interfacial region. In particular the Si substrate should be cleaned before deposition occurs, such cleaning comprising a degreasing step followed by chemical etch. It may also be desirable to passivate the surface of the substrate by oxidation before it is ready for use, the oxide layer being removed before the active layer is deposited.

Methods may also be used to minimise structural problems at the interfacial layer. These methods may include forming a buffer layer of smooth Si then growing a monolayer of an elemental layer such as Zn, Se or As upon which the active layer is then deposited.

BRIEF DESCRIPTION OF THE DRAWINGS

FIG. 2 shows the room temperature photoluminescence spectra of $ZnS_{1-x}Te_x$ for x=0.01, x=0.064, x=0.3 and x=0.707 when grown on GaAs, and FIG. 3 shows the room temperature photoluminescence spectra of $ZnS_{1-x}Te_x$ for x=0.01 and x=0.03 when grown on Si.

DETAILED DESCRIPTION OF PREFERRED EMBODIMENTS

Figure 1:
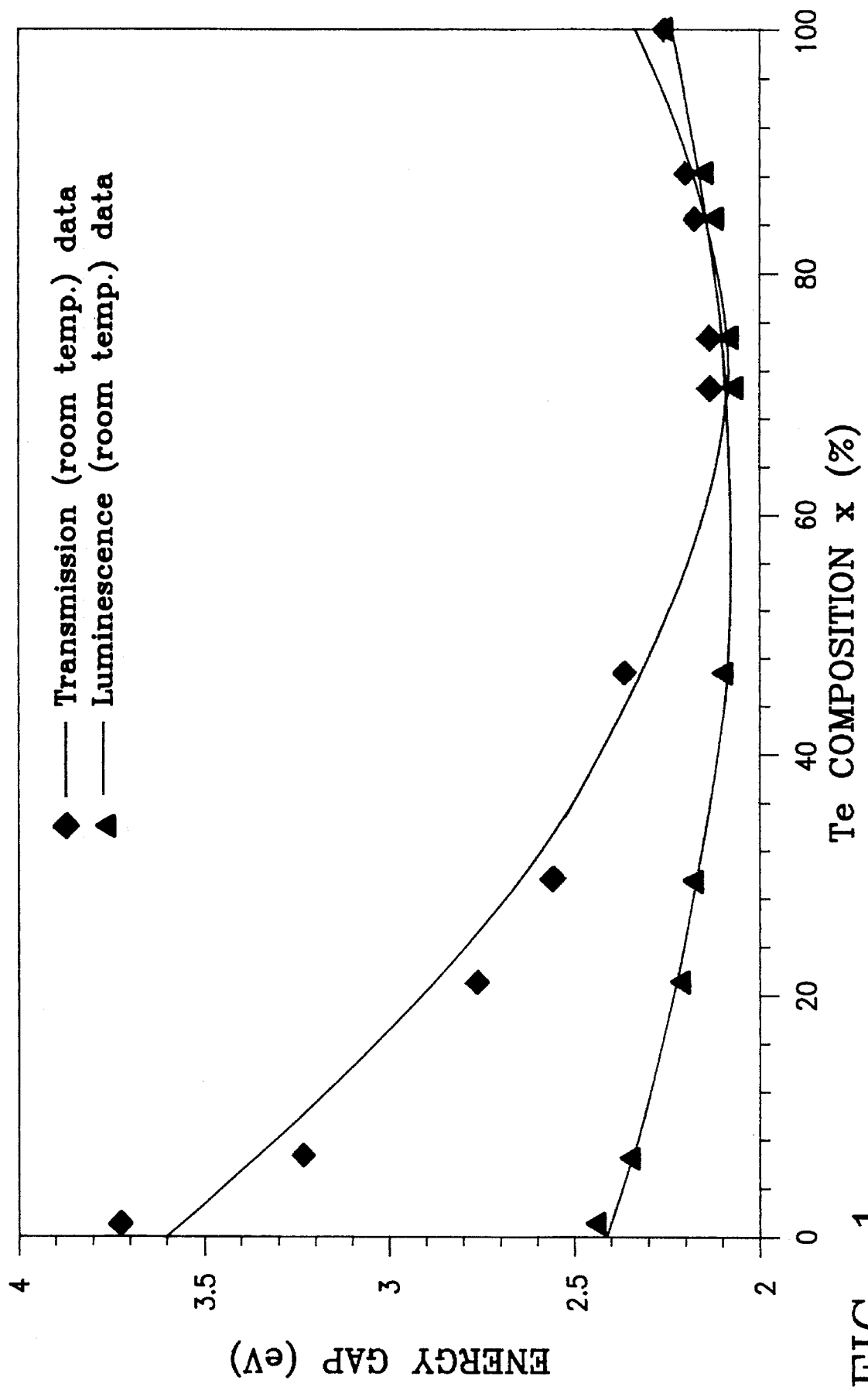
FIG. 1 shows the relationship between band gap energy and luminescence peak position as a function of Te composition x.

In preferred embodiments of the present invention the active photoluminescent layer is formed on the semiconductor substrate by molecular beam epitaxy (MBE) using a VG V80H system. Semi-insulating GaAs (001) substrates with 2+0.1° off toward the <011> direction, and Si (001) substrates were used. When using Si as a substrate pre-growth treatment is important for achieving high-quality epilayers. Before loading into the MBE chamber the Si wafers were cleaned using the standard RCA method (W. Kern and D. A. Puotinen, *RCA Rev.* 31(1970) 187) which starts with a degreasing step followed by a wet chemical etch. The substrates were then passivated with a thin oxide layer. After loading into the MBE chamber the substrates were first outgassed at 450° C. and then heated to 800° C. to remove the oxide layer.

$ZnS_{1-x}Te_x$ alloy layers were grown using ZnS and ZnTe sources contained in separate effusion cells. Te composition was controlled by adjusting the cell temperatures. The optimal growth temperature was found to depend strongly on the desired Te composition of the alloy. As Te composition increases from x=0 to x=1 the optimal growth temperature increases from 160° C. to 300° C.

The Te composition of the thus formed $ZnS_{1-x}Te_x$ layers was determined using energy dispersive X-ray spectrometry carried out in an EDAX DX-4 system. The measurements were done using a 15 KeV electron beam. The calibration and normalization of the measured data were performed using MBE-grown ZnS and ZnTe layers as standard references. The Te composition was determined to an accuracy of within 0.01.

The transmission spectra of the alloys were obtained at room temperature on samples with the GaAs substrate removed by chemical etching. The band gap energy was estimated from the absorption edge of these spectra. Photoluminescence measurements were performed at room temperature using either a frequency-doubled output (wavelength=395 nm, pulse width=200 fs) of a regeneratively amplified mode-locked Ti-sapphire operating at 1 kHz, or a 200 Watt Hg lamp with suitable UV filters.

The structural characterization on a set of $ZnS_{1-x}Te_x$ epilayers with 0<x<1 has been performed using high resolution X-ray diffraction (HRXRD). $ZnS_{1-x}Te_x$ alloys are found to be lattice matched to GaAs at about x=0.27, and to Si at about x=0.03. The details of their structural characteristics are reported by the present inventors in the Proceedings of the 1994 Materials Research Society Spring Meeting, San Francisco.

The band energy gap determined from optical transmission measurements is plotted as a function of Te composition x in FIG. 1. A strong bowing effect is clearly visible with the largest bowing occurring at about 70% Te composition.

The photoluminescence (PL) spectra obtained from four samples of $ZnS_{1-x}Te_x$ grown on GaAs substrates are shown in FIG. 2, and the corresponding results from two samples grown on Si substrates are shown in FIG. 3. Two general features may be observed. Firstly the width of the PL peak is broader than those previously observed with ZnS and ZnTe compounds. This broadening increases as Te composition decreases. Secondly the integrated luminescence intensity of an $ZnS_{1-x}Te_x$ alloy is much greater than for ZnS and ZnTe compounds, and this also increases as Te composition decreases. The broadening of the PL peak is attributed to efficient hole capture and exciton "self trapping" at Te sites. The fact that isoelectronic trapping only occurs at low Te levels is believed to arise from the large difference in the electronegativity of Te compared to S. The observation that broadening and integrated intensity decrease with increasing Te concentration indicates that the effective density of the isoelectronic centres decreases as Te concentration increases.

The peak position of the photoluminescence spectrum for each ZnSTe layer is defined as the wavelength (which can be converted into the energy gap) of the highest luminescence intensity in the spectrum. As shown in FIG. 2 there are four spectra corresponding to the four samples with differing Te concentrations. Each curve has some peaks and troughs due to interference effects, but these can easily be removed and a smooth curve obtained from which a peak may be extracted. FIG. 1 plots these peak values against Te composition. By comparison of the luminescence data with the corresponding transmission data it will be seen that the photoluminescence peaks are Stokes shifted from the bandgap energy as determined from the transmission measurements. Where photoluminescence results from band to band transitions the Stokes shift is small, but in the present case there is a large Stokes shift due to the fact that the source of luminescence is Te isoelectronic traps.

Growth of good quality III–V and II–VI layers on silicon substrates is usually hampered by the formation of anti-domains near the interface between the polar (III–V and II–VI) and non-polar (Si) semiconductors. In order to achieve the best possible growth a particular Te composition was chosen so that the resulting alloy is lattice matched to the Si substrate to ensure pseudomorphic growth. As has been mentioned previously such lattice matching to Si may be achieved when x=0.03 approximately. By fine tuning of the Te concentration it is possible to grow epitaxial layers lattice matched on silicon to within 0.2%.

It is also possible to buffer the otherwise abrupt polar non-polar transition by growing a monolayer of elemental species on the Si substrate to avoid the formation of such anti-domains. Zn, Se and As are possible materials. Observations suggest however that there will remain a disordered interfacial region for the first few monolayers of the epitaxial layer before a smooth epitaxial layer is achieved. High quality ZnSTe layers can be obtained if a smooth Si buffer layer is first grown followed by the growth of a monolayer of elemental species such as Zn, Se or As on which the active layer is then grown.

Despite the problems associated with the low structural quality of the $Si/ZnS_{1-x}Te_x$ interface the intensity of room temperature PL from samples grown on Si was as strong as those grown on GaAs substrates. PL spectra of $ZnS_{1-x}Te_x$ epilayers grown on Si substrates exhibit the general features associated with Te isoelectronic hole traps such as large broadening of the luminescence lineshape and the large Stokes shift from the band edge, similar to the observations of the samples grown on GaAs. The structural defects near the interface with the Si substrate do not appear to affect the PL properties of the epitaxial layer.

The quantum efficiency of PL from $ZnS_{-1-x}Te_x$ layers are significantly higher than for known ZnSe and ZnS layers. PL from samples in accordance with the present invention could be clearly seen with the naked eye under normal room light conditions when the layers were illuminated by 5 mW of unfocused UV light from a Hg lamp. Under illumination by bright sunlight with proper UV filtering luminescence can also be seen with the naked eye.

The room temperature Pl efficiency was measured by the following method. A 200 Watt Hg lamp was used as the excitation source. The light beam from the lamp was sent through a combination of three filters, firstly a piece of plain glass to remove the ozone-generating UV, then a UG-11 filter to remove visible radiation except for the red and infra-red regions of the spectrum, and finally an interference band pass filter (10 nm in half-width) centered at 365 nm. The light was then incident on the sample surface at an angle of incidence of approximately 45°. The incident beam as focused onto a 2×3 mm$^2$ spot and its total power was 5 mW as measured by a Newport Model 835 Picowatt Digital Power Meter with an attenuated 835-Uv detector.

The luminescence from the sample was so strong that the same power meter was sufficiently sensitive to measure the luminescence. To do so the detector surface was placed in a plane containing the sample surface normal direction and was perpendicular to the incident direction of the excitation beam so as to avoid specular reflection of the excitation beam. A Si wafer with similar surface morphology as the samples was used to measure the intensity of the scattered light and this was found to be insignificant as compared with the intensity of the luminescence. A filter was placed in front of the detector to remove further scattered UV radiation.

A cos[theta] dependence of the measured luminescence intensity was found as the detector was moved in the vertical plane where [theta] was the angle between the direction from the spot to the detector and the surface normal direction. The luminescence intensity was then measured as a function of the distance r between the spot and the detector at [theta]=0 and was found to decrease with 1/r$^2$. The total luminescence through the whole hemisphere was then calculated, taking into account the spectral response of the power meter and the reflectance of the sample at 365 nm. The measured efficiencies of the samples ranged from 2 to 4% with layers of about 1.5 microns thickness. The efficiency will depend on the thickness of the layer and the quality of the sample as well as the wavelength used to excite the layer.

In summary the present invention provides a luminescent material that may be grown by molecular beam epitaxy on a GaAs or Si substrate. Other possible materials upon which the layer may be deposited include ZnSe and InP. The material shows a strong enhancement in photoluminescence efficiency, a large Stokes shift from the band edge, a broadening in the luminescence peak and a strong bowing of the band gap energy as a function of Te composition. The relatively high PL efficiency and the fact that the layers can be grown directly on Si make $ZnS_{1-x}Te_x$ a good material for use in the manufacture of optoelectronic devices such as light emitting diodes and thin film electroluminescence devices. Furthermore since the photoluminescence efficiency is high it is even possible to observe photoluminescence by photoexcitation under strong sunlight and the materials of the present invention could also be applied to the construction of a UV detector.

We claim:

1. A light-emitting material comprising an active luminescent layer of $ZnS_{1-x}Te_x$ (0<x<0.07) deposited directly on a substrate selected from the group consisting of GaAs and Si, said active layer being deposited by molecular beam epitaxy.

2. A material as claimed in claim 1 wherein said substrate is Si and $0.01 \leq x$.

3. A material as claimed in claim 2 wherein x=0.03.

4. A material as claimed in claim 1 wherein the substrate is GaAs and $0.01 \leq x$.

* * * * *